(12) United States Patent
Haubold et al.

(10) Patent No.: US 10,329,140 B2
(45) Date of Patent: Jun. 25, 2019

(54) SEMICONDUCTOR DEVICE, PRESSURE SENSOR, MICROPHONE, AND ACCELERATION SENSOR

(71) Applicant: Infineon Technologies AG, Neubiberg (DE)

(72) Inventors: Marco Haubold, Dresden (DE); Henning Feick, Dresden (DE); Kerstin Kaemmer, Radebeul (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/892,102

(22) Filed: Feb. 8, 2018

(65) Prior Publication Data

US 2018/0222744 A1  Aug. 9, 2018

(30) Foreign Application Priority Data

Feb. 9, 2017  (DE) .................. 10 2017 102 545

(51) Int. Cl.
*B81B 3/00* (2006.01)
*H01L 27/00* (2006.01)

(52) U.S. Cl.
CPC .......... *B81B 3/0021* (2013.01); *B81B 3/0086* (2013.01); *B81B 2201/0235* (2013.01); *B81B 2201/0257* (2013.01); *B81B 2201/0264* (2013.01)

(58) Field of Classification Search
CPC .... B81B 2201/0264; B81B 2201/0257; B81B 2201/0235; B81B 3/0021; B81B 3/0024; B81B 3/0051; B81B 3/0086; B81B 3/0091; H01L 23/538; H01L 23/5381; H01L 23/5386; H01L 25/50; H01L 25/0657; H01L 25/18; H01L 27/14; H01L 27/22; H01L 27/06888
See application file for complete search history.

(56) References Cited

U.S. PATENT DOCUMENTS

2007/0202628 A1* 8/2007 Wuertz .............. B81C 1/00246
438/53

* cited by examiner

*Primary Examiner* — Nikolay K Yushin
(74) *Attorney, Agent, or Firm* — Slater Matsil, LLP

(57) ABSTRACT

A semiconductor device includes at least one suspension region of a membrane structure, where the suspension region lies laterally in a first region of a surface of a semiconductor substrate; and a membrane region of the membrane structure, where a cavity is arranged vertically between the membrane region and at least one part of the semiconductor substrate, and the first region of the surface of the semiconductor substrate is formed by a surface of a shielding doping region of the semiconductor substrate.

20 Claims, 5 Drawing Sheets

SEMICONDUCTOR DEVICE, PRESSURE SENSOR, MICROPHONE, AND ACCELERATION SENSOR

This application claims the benefit of German Application No. 10 2017 102 545.6, filed on Feb. 9, 2017, which application is hereby incorporated herein by reference in its entirety.

TECHNICAL FIELD

Examples relate to production technologies for semiconductor devices, and in particular to semiconductor devices, a pressure sensor, a microphone, an acceleration sensor and a method for forming a semiconductor device.

BACKGROUND

A semiconductor device (for example a pressure sensor, a microphone or an acceleration sensor) often comprises a membrane. A high mechanical stability of the membrane may be desirable in this case.

SUMMARY

Some examples relate to a semiconductor device. The semiconductor device comprises at least one suspension region of a membrane structure. The suspension region lies laterally in a first region of a surface of a semiconductor substrate. In addition, the semiconductor device comprises a membrane region of the membrane structure. A cavity is arranged vertically between the membrane region and at least one part of the semiconductor substrate. In addition, the first region of the surface of the semiconductor substrate is formed by a surface of a shielding doping region of the semiconductor substrate. Furthermore, the shielding doping region of the semiconductor substrate adjoins an adjacent doping region. In addition, the adjacent doping region forms at least one part of the surface of the semiconductor substrate in the region of the cavity. Furthermore, the adjacent doping region has a first conductivity type and the shielding doping region has a second conductivity type.

Some examples relate to a semiconductor device. The semiconductor device comprises at least one suspension region of a membrane structure. The suspension region lies laterally in a first region of a surface of a semiconductor substrate. In addition, an insulation layer is arranged vertically between the suspension region of the membrane structure and the first region of the surface of the semiconductor substrate. Furthermore, the semiconductor device comprises a membrane region of the membrane structure. A cavity is arranged vertically between the membrane region and at least one part of the semiconductor substrate. In addition, a maximum vertical distance between points at an edge area of the cavity that faces the semiconductor substrate is less than 10 nm.

Some examples relate to a pressure sensor, a microphone or an acceleration sensor comprising a semiconductor device.

Some examples relate to a method for forming a semiconductor device. The method comprises forming a membrane structure. The membrane structure comprises a membrane region and at least one suspension region. In addition, the suspension region lies laterally in a first region of a surface of a semiconductor substrate. Furthermore, the method comprises forming a cavity vertically between the membrane region and at least one part of the semiconductor substrate. The first region of the surface of the semiconductor substrate is formed by a surface of a shielding doping region of the semiconductor substrate. In addition, the shielding doping region of the semiconductor substrate adjoins an adjacent doping region. Furthermore, the adjacent doping region forms at least one part of the surface of the semiconductor substrate in the region of the cavity. Furthermore, the adjacent doping region has a first conductivity type and the shielding doping region has a second conductivity type.

BRIEF DESCRIPTION OF THE DRAWINGS

Exemplary embodiments are explained in greater detail below with reference to the accompanying figures, in which.

DETAILED DESCRIPTION OF ILLUSTRATIVE EMBODIMENTS

Figure 1:
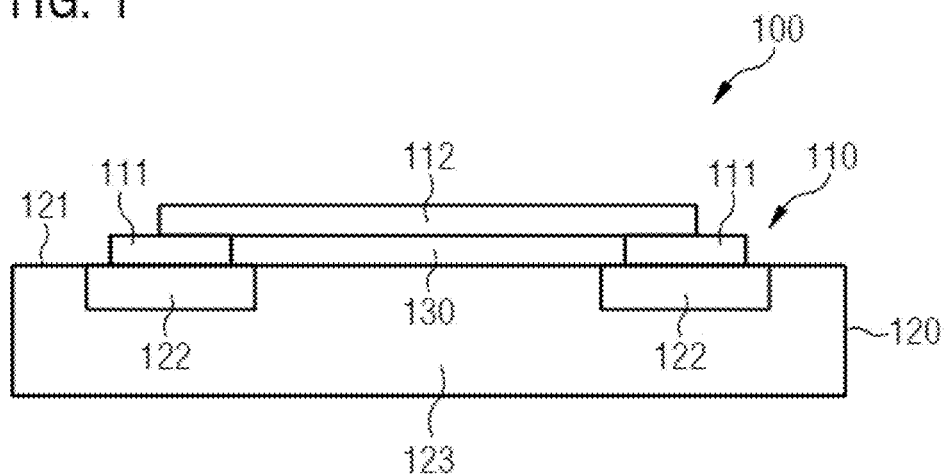
FIG. 1 shows a schematic cross section of a semiconductor device.

Various exemplary embodiments will now be described more thoroughly with reference to the accompanying drawings, in which some exemplary embodiments are illustrated. In the figures, the thickness dimensions of lines, layers and/or regions may be illustrated in an exaggerated manner for the sake of clarity.

In the following description of the accompanying figures, which merely show some illustrative exemplary embodiments, identical reference signs may designate identical or comparable components. Furthermore, collective reference signs may be used for components and objects which occur multiply in an exemplary embodiment or in a drawing but are described jointly with regard to one or more features. Components or objects described with identical or collective reference signs, with regard to individual, a plurality or all of the features, for example their dimensions, may be embodied identically, but possibly also differently, unless the description explicitly or implicitly reveals something else.

Although exemplary embodiments may be modified and altered in various ways, exemplary embodiments are illustrated as examples in the figures and are described thoroughly herein. It should be clarified, however, that the intension is not for exemplary embodiments to be restricted to the forms respectively disclosed, rather that exemplary embodiments are intended to cover all functional and/or structural modifications, equivalents and alternatives which lie within the scope of the invention. Identical reference signs designate identical or similar elements throughout the description of the figures.

It should be noted that one element referred to as being "connected" or "coupled" to another element may be directly connected or coupled to the other element or intervening elements may be present. If two elements A and B are combined by an "or", then this should be understood to include all possible combinations, for example "only A", "only B" and "A and B". An alternative formulation for the same combination is "at least one of A and B". The same applies to the combinations of more than two elements.

The terminology used herein serves only to describe specific exemplary embodiments and is not intended to restrict the exemplary embodiments. As used herein, the singular forms "a" "an", "one" and "the" are also intended to include the plural forms, as long as the context does not clearly indicate something to the contrary. Furthermore, it should be clarified that the expressions such as e.g. "comprises", "comprising", "has" and/or "having", as used herein, indicate the presence of stated features, integers, steps, work sequences, elements and/or components, but do not preclude the presence or addition of one or a plurality of features, integers, steps, work sequences, elements, components and/or groups thereof.

As long as there is no definition to the contrary, all terms (including technical and scientific terms) used herein have the same meaning ascribed to them by a person of average skill in the art in the field with which the exemplary embodiments are associated. Furthermore, it should be clarified that expressions, e.g. those defined in dictionaries generally used, should be interpreted as if they had the meaning consistent with their meaning in the context of the relevant art, as long as a definition to the contrary is not expressly given herein.

FIG. 1 shows a schematic cross section of a semiconductor device 100. The semiconductor device 100 comprises at least one suspension region 111 of a membrane structure 110. The suspension region 111 lies laterally in a first region of a surface 121 of a semiconductor substrate 120. In addition, the semiconductor device 100 comprises a membrane region 112 of the membrane structure 110. A cavity 130 is arranged vertically between the membrane region 112 and the at least one part of the semiconductor substrate 120. Furthermore, the first region of the surface 121 of the semiconductor substrate 120 is formed by a surface of a shielding doping region 122 of the semiconductor substrate 120. Furthermore, the shielding doping region 122 of the semiconductor substrate 120 adjoins an adjacent doping region 123. In addition, the adjacent doping region 123 forms at least one part of the surface 121 of the semiconductor substrate 120 in the region of the cavity 130. Furthermore, the adjacent doping region 123 has a first conductivity type and the shielding doping region 122 has a second conductivity type.

By virtue of the different conductivity types of the shielding doping region 122 and of the adjacent doping region 123, a p-n junction can be formed at a junction between the shielding doping region 122 and the adjacent doping region 123. As a result, a depletion layer can be produced at the junction between the shielding doping region 122 and the adjacent doping region 123. The depletion layer produced can bring about an electrical insulation of the suspension region 111 and thus of the entire membrane structure 110 from further regions of the semiconductor substrate 120 (for example from a counterelectrode doping region of the semiconductor substrate 120 or from a bulk region of the semiconductor substrate 120). It is thereby possible to reduce a parasitic capacitance between the membrane structure 110 and the further regions of the semiconductor substrate 120. As a result, a capacitance between the membrane region 112 and a counterelectrode doping region of the semiconductor substrate 120 can be detected with an improved signal to noise ratio. As a result, the membrane structure 110 can have improved electrical properties. As a result, moreover, a structured insulation element (for example a structured dielectric) lying between the membrane suspension 111 and the surface 121 of the semiconductor substrate 120 and thus a topography step below the membrane structure 110 can be obviated. Obviating the topography step below the membrane structure 110 makes it possible to avoid transferring the topography step to the membrane region 112 of the membrane structure 110 (for example during a deposition of the membrane structure 110). As a result, an influencing of mechanical properties of the membrane structure 110 (for example stiffness or natural frequency of the membrane region 112) by a topography step transferred to the membrane region 112 can be avoided. As a result, a fluctuation of a behavior of semiconductor devices 100 within a production batch can be reduced and/or structural weak points in the membrane structure 110 can be avoided and a yield can thereby be increased. The semiconductor device 100 can be provided more cost effectively as a result. In addition, obviating the topography step transferred to the membrane region 112 makes it possible to avoid bending of the membrane region 112 in the direction of the surface 121 of the semiconductor substrate 120 and thus fixing of the membrane region 112 to the surface 121 of the semiconductor substrate 120 during chemical mechanical polishing of the semiconductor device 100. As a result, it is possible to increase a yield in production of the semiconductor device 100. The semiconductor device 100 can be provided more cost effectively as a result.

By way of example, the membrane structure 110 can be a silicon (Si) based membrane structure (for example based on polysilicon or monocrystalline silicon). By way of example, the membrane structure 110 can be a monolithic membrane structure. The membrane structure 110 can have for example the first conductivity type or the second conductivity type. By way of example, the membrane structure 110 can have an average dopant concentration of more than $1*10^{16}$ (or more than $1*10^{17}$ or more than $1*10^{18}$) atoms per cm3 and less than $1*10^{21}$ (or less than $1*10^{20}$ or less than $1*10^{19}$) atoms per $cm^3$. By way of example, the membrane structure 110 can be a boron doped (for example a heavy boron doped) silicon membrane structure. The membrane structure 110 can comprise a single electrically conductive layer. Optionally, a further layer (for example a passivation layer) can be arranged on or below the membrane region 112 of the membrane structure 110. By way of example, a silicon nitride layer can lie at a surface of the membrane structure 110 that faces away from the cavity 130. A passivation of the membrane structure 110 can be brought about as a result. By way of example, a lateral dimension (for example a width) of the membrane structure 110 or of the membrane region 112 can be more than 1 μm (or more than 5 μm, more than 8 µm or more than 10 nm) and less than 50 µm (or less than 30 µm, less than 20 µm or less than 14 µm). A vertical dimension (for example a thickness) of the membrane region 112 can be for example more than 10 nm (or more than 50 nm or more than 100 nm) and less than 1 µm (or less than 500 nm, less than 250 nm or less than 150 nm). By way of example, a lateral dimension (for example a width) of the suspension region 111 can be more than 100 nm (or more than 500 nm or more than 1 µm) and less than 15 µm (or less than 10 µm or less than 5 µm). A vertical dimension (for example a thickness) of the suspension region 111 can be for example more than 10 nm (or more than 50 nm or more than 100 nm) and less than 1 µm (or less than 500 nm, less than 250 nm or less than 150 nm). By way of example, the suspension region 111 can have a rectangular lateral cross section. The suspension region 111 can for example laterally surround the cavity 130 from at least three sides.

By way of example, a lateral dimension (for example a width) of the cavity 130 can be more than 1 µm (or more than 5 µm, more than 8 µm or more than 10 µm) and less than 50 µm (or less than 30 µm, less than 20 µm or less than 15 µm). A vertical dimension (for example a height) of the cavity 130 can be for example more than 10 nm (or more than 50 nm or more than 100 nm) and less than 1 µm (or less than 500 nm, less than 250 nm or less than 150 nm). By way of example, a predetermined gas volume (for example a predetermined air volume) can be enclosed in the cavity 130. Alternatively, the cavity 130 can be open toward an environment of the semiconductor device 100. By way of example, the membrane structure 110 can have at least one lateral opening and/or at least one vertical opening (for example for removing a sacrificial layer when forming the cavity 130).

By way of example, a vertical dimension (for example a thickness) of the shielding doping region 122 can be more than 100 nm (or more than 200 nm or more than 500 nm) and less than 10 µm (or less than 5 µm or less than 1 µm). A lateral dimension (for example a width) of the shielding doping region 122 can be for example more than 100% (or more than 105%, more than 110%, more than 125% or more than 150%) of a lateral dimension of the suspension region 111. By way of example, the suspension region 111 can be at a lateral distance of more than 5 nm (or more than 10 nm or more than 25 nm) from at least one edge of the shielding doping region 122. Manufacturing tolerances can be compensated for as a result.

By way of example, the shielding doping region 122 can have an average dopant concentration of more than $1*10^{16}$ atoms per $cm^3$ (or more than $1*10^{17}$ atoms per $cm^3$ or more than $1*10^{18}$ atoms per $cm^3$) and less than $1*10^{21}$ atoms per $cm^3$ (or less than $1*10^{20}$ atoms per $cm^3$ or less than $1*10^{19}$ atoms per $cm^3$).

By way of example, the shielding doping region 122 can comprise a first subregion having an average dopant concentration of more than $1*10^{17}$ atoms per $cm^3$ (or more than $1*10^{18}$ atoms per $cm^3$ or more than $1*10^{19}$ atoms per $cm^3$) and less than $1*10^{21}$ atoms per $cm^3$ (or less than $1*10^{20}$ atoms per $cm^3$) and a second subregion having an average dopant concentration of more than $1*10^{16}$ atoms per $cm^3$ (or more than $5*10^{16}$ atoms per $cm^3$) and less than $1*10^{18}$ atoms per $cm^3$ (or less than $5*10^{17}$ atoms per $cm^3$). The first subregion can have a vertical dimension of more than 50 nm (or more than 100 nm, more than 150 nm or more than 200 nm). In addition, the second subregion can have a vertical dimension of more than 100 nm (or more than 250 nm, more than 500 nm or more than 1000 nm). By virtue of the lower dopant concentration of the second subregion 111 comparison with the first subregion, the second subregion can be formed more cost effectively (for example by means of implantation). The semiconductor device 100 can be provided more cost effectively as a result. By way of example, a maximum vertical distance between the second subregion and the surface 121 of the semiconductor substrate 120 can be more than 200% (or more than 300%, more than 400% or more than 500%) of a maximum vertical distance between the first subregion and the surface 121 of the semiconductor substrate 120. The second subregion can lie for example below the first subregion 111 the semiconductor substrate 120. By way of example, the first subregion can be in contact with the second subregion.

By way of example, the adjacent doping region 123 can surround the shielding doping region 122 from three sides. The adjacent doping region 123 can for example be in contact with the shielding doping region 122 and thereby adjoin the shielding doping region 122. By way of example, a vertical dimension of the adjacent doping region 123 can be more than 100% (or more than 200%, more than 300% or more than 500%) of a lateral dimension of the shielding doping region 122. By way of example, the adjacent doping region can have an average dopant concentration of more than $1*10^{14}$ atoms per $cm^3$ (or more than $1*10^{15}$ atoms per $cm^3$) and less than $1*10^{18}$ atoms per $cm^3$ (or less than $1*10^{17}$ atoms per $cm^3$ or less than $1*10^{16}$ atoms per $cm^3$). By way of example, the adjacent doping region 123 can be a well doping region (e.g. having an average dopant concentration of more than $1*10^{16}$ atoms per $cm^3$ and less than $1*10^{18}$ atoms per $cm^3$) or a bulk doping region of the semiconductor substrate 120. A reference potential (e.g. ground potential) can be employed to the bulk doping region for example via a rear side contact or a front side terminal.

By way of example, the suspension region 111 of the membrane structure 110 can extend laterally from the cavity 130 maximally as far as an edge of the first region of the surface 121 of the semiconductor substrate 120. An electrical insulation of the membrane structure 110 from the adjacent doping region 123 and thus from a bulk region of the semiconductor substrate 120 can be improved as a result. By way of example, a lateral distance between the suspension region 111 of the membrane structure 110 and the edge of the first region of the surface 121 of the semiconductor substrate 120 can be more than 5 nm (or more than 10 nm or more than 25 nm) or more than 1% (more than 5%, more than 10% or more than 25%) of a lateral dimension of the first region of the surface 121 of the semiconductor substrate 120. The edge of the first region of the surface 121 of the semiconductor substrate 120 can for example lie laterally outside the cavity 130.

By way of example, the suspension region 111 of the membrane structure 110 can be arranged laterally completely within the first region of the surface 121 of the semiconductor substrate 120. An electrical insulation of the membrane structure 110 from the adjacent doping region 123 and thus from a bulk region of the semiconductor substrate 120 can be improved as a result.

By way of example, the adjacent doping region 123 can laterally completely surround the shielding doping region 122 within the semiconductor substrate 120. As a result, the depletion layer produced at the junction between the shielding doping region 122 and the adjacent doping region 123 can laterally completely surround the shielding doping region 122. An electrical insulation of the membrane structure 110 from the bulk region of the semiconductor substrate 120 can be improved as a result. By way of example, the adjacent doping region 123 can laterally completely surround the shielding doping region 122 outside the cavity 130.

By way of example, a maximum vertical distance between points at the surface 121 of the semiconductor substrate 120 in the (entire) region of the cavity 130 can be less than 10 nm (or less than 5 nm or less than 2 nm). As a result, it is possible to prevent a topography structure (for example a topography step) from being transferred to the membrane region 112 of the membrane structure 110. As a result, mechanical properties of the membrane structure 110 (for example stiffness or natural frequency of the membrane region 112) can be improved and/or set.

By way of example, a maximum vertical distance between points at a surface of the membrane region 112 of the membrane structure 110 in a non-loaded state of the membrane region 112 of the membrane structure 110 can be less than 10 nm (or less than 5 nm or less than 2 nm). As a result, the membrane region 112 can have a high stiffness. By way of example, in the non-loaded state of the membrane region 112, a pressure in the cavity 130 and thus on a surface of the membrane region 112 that faces the cavity 130 and an external pressure acting on a surface of the membrane region 112 that faces away from the cavity (for example an atmospheric pressure acting on the semiconductor device 100) can be identical. The surface of the membrane region 112 of the membrane structure 110 can be for example a surface of the membrane region 112 that faces the cavity 130 or a surface of the membrane region 112 that faces away from the cavity 130.

By way of example, a second region of the surface 121 of the semiconductor substrate 120 in the region of the cavity 130 can be formed by a counterelectrode doping region. The counterelectrode doping region can have the second conductivity type. As a result, a counterelectrode for the membrane structure 110 can be efficiently integrated into the semiconductor substrate 120. By way of example, a lateral dimension (for example a width) of the second region of the surface 121 of the semiconductor substrate 120 can be more than 30% (or more than 50% or more than 70%) and less than 99% (or less than 95% or less than 90%) of a lateral dimension (for example a width) of the cavity 130.

By way of example, the adjacent doping region 123 can adjoin the counterelectrode doping region or be in contact with the counterelectrode doping region. As a result, a p-n junction can be formed at a junction between the adjacent doping region 123 and the counterelectrode doping region and a depletion layer can be produced as a result. As a result, the counterelectrode doping region can be electrically insulated from a bulk region of the semiconductor substrate 120 and from the shielding doping region 122.

By way of example, the adjacent doping region 123 and/or the shielding doping region 122 can laterally surround the counterelectrode doping region at least three sides.

By way of example, the counterelectrode doping region can have an average dopant concentration of more than $1*10^{16}$ atoms per cm$^3$ (or more than $1*10^{17}$ atoms per cm$^3$ or more than $1*10^{18}$ atoms per cm$^3$) and less than $1*10^{21}$ atoms per cm$^3$ (or less than $1*10^{20}$ atoms per cm$^3$ or less than $1*10^{19}$ atoms per cm$^3$).

By way of example, the counterelectrode doping region can comprise a first subregion having an average dopant concentration of more than $1*10^{17}$ atoms per cm$^3$ (or more than $1*10^{18}$ atoms per cm$^3$ or more than $1*10^{19}$ atoms per cm$^3$) and less than $1*10^{21}$ atoms per cm$^3$ (or less than $1*10^{20}$ atoms per cm$^3$) and a second subregion having an average dopant concentration of more than $1*10^{16}$ atoms per cm$^3$ (or more than $5*10^{16}$ atoms per cm$^3$) and less than $1*10^{18}$ atoms per cm$^3$ (or less than $5*10^{17}$ atoms per cm$^3$). The first subregion can have a vertical dimension of more than 50 nm (or more than 100 nm, more than 150 nm or more than 200 nm). In addition, the second subregion can have a vertical dimension of more than 100 nm (or more than 250 nm, more than 500 nm or more than 1000 nm). By virtue of the lower dopant concentration of the second subregion in comparison with the first subregion, the second subregion can be formed more cost effectively (for example by means of implantation). The semiconductor device 100 can be provided more cost effectively as a result. By way of example, a maximum vertical distance between the second subregion and the surface 121 of the semiconductor substrate 120 can be more than 200% (or more than 300%, more than 400% or more than 500%) of a maximum vertical distance between the first subregion and the surface 121 of the semiconductor substrate 120. The second subregion can for example lie below the first subregion in the semiconductor substrate 120. By way of example, the first subregion can be in contact with the second subregion.

By way of example, a lateral dimension of the counterelectrode doping region can be more than 30% (or more than 50%, more than 75% or more than 90%) of a lateral dimension of the cavity 130. A capacitive of a capacitor formed by the membrane structure 110 (or by the membrane region 112) and the counterelectrode doping region can be optimized as a result. By way of example, a vertical dimension of the counterelectrode doping region can be more than 100 nm (or more than 200 nm or more than 500 nm) and less than 10 μm (or less than 5 μm or less than 1 μm).

By way of example, the shielding doping region 122 can be laterally separated from the counterelectrode doping region by the adjacent doping region 123. As a result, it is possible to avoid a lateral shunt connection in the semiconductor substrate 120 between the membrane structure 110 and the counterelectrode doping region.

By way of example, a subregion of the adjacent doping region 123 can have an average dopant concentration of more than $1*10^{16}$ atoms per cm$^3$ (or more than $1*10^{17}$ atoms per cm$^3$ or more than $1*10^{18}$ atoms per cm$^3$) and less than $1*10^{21}$ atoms per cm$^3$ (or less than $1*10^{20}$ atoms per cm$^3$ or less than $1*10^{19}$ atoms per cm$^3$).

By way of example, the adjacent doping region 123 can comprise a first subregion having an average dopant concentration of more than $1*10^{17}$ atoms per cm$^3$ (or more than $1*10^{18}$ atoms per cm$^3$, more than $1*10^{19}$ atoms per cm$^3$ or more than $5*10^{19}$ atoms per cm$^3$) and less than $1*10^{21}$ atoms per cm$^3$ (or less than $5*10^{20}$ atoms per cm$^3$) and a second subregion having an average dopant concentration of more than $1*10^{16}$ atoms per cm$^3$ (or more than $1*10^{17}$) and less than $1*10^{18}$ atoms per cm$^3$. The first subregion can have a vertical dimension of more than 25 nm (or more than 50 nm or more than 100 nm). In addition, the second subregion can have a vertical dimension of more than 100 nm (or more than 250 nm, more than 500 nm or more than 1000 nm). By virtue of the lower dopant concentration of the second subregion in comparison with the first subregion, the second subregion can be formed more cost effectively (for example by means of implantation). The semiconductor device 100 can be provided more cost effectively as a result. By way of example, a maximum vertical distance between the second subregion and the surface 121 of the semiconductor substrate 120 can be more than 200% (or more than 300%, more than 400% or more than 500%) of a maximum vertical distance between the first subregion and the surface 121 of the semiconductor substrate 120. The second subregion can for example lie below the first subregion 111 the semiconductor substrate 120. By way of example, the first subregion can be in contact with the second subregion.

By way of example, a vertical distance between the membrane structure 110 and the surface 121 of the semiconductor substrate 120 at a feedthrough part of an edge of the membrane structure 110 can be more than 50% (or more than 60%, more than 70%, more than 80%, more than 90% or more 95%) of a vertical distance between the membrane region 112 of the membrane structure 110 and the surface 121 of the semiconductor substrate 120 in the region of the cavity 130 in a non-loaded state of the membrane region 112 of the membrane structure 110. As a result, it is possible to reduce a parasitic capacitance between the counterelectrode doping region and the membrane structure 110 in the region of the feedthrough part.

By way of example, the semiconductor device 100 can furthermore comprise a contacting structure. Different voltages can be able to be applied to the membrane structure 110 and the shielding doping region 122 of the semiconductor substrate 120 via the contacting structure. As a result, the membrane structure 110 and the shielding doping region 122 can be connected to different voltage sources. By way of example, the contacting structure can comprise a first vertical contact (for example a via) in conjunction with a first lateral structured metal layer (for example a lateral copper layer) for applying a first voltage to the membrane structure 110, a second vertical contact (for example a via) in conjunction with a second lateral structured metal layer (for example a lateral copper layer) for applying a second voltage to the shielding doping region 122 and/or a third vertical contact (for example a via) in conjunction with a third lateral structured metal layer (for example a lateral copper layer) for applying a third voltage to the counterelectrode doping region.

By way of example, the semiconductor device can furthermore comprise a control circuit. The control circuit can be configured to provide the same voltage to the membrane structure 110 and the shielding doping region 122 of the semiconductor substrate 120. By way of example, an identical voltage signal can be applied, which, however, is generated in separate sources and has a different reference point than is the case for the membrane. As a result, by way of example, a minimization of influencing of the measurement signal of the membrane by the same signal in the region of the shielding doping region 122 can be made possible. Alternatively, the same voltage from the same voltage source can be applied to the membrane structure 110 and the shielding doping region 122. As a result, it is possible to minimize parasitic capacitances between the membrane structure 110 and the shielding doping region 122. By way of example, the control circuit can be electrically conductively connected to the contacting structure.

By way of example, the control circuit can be configured to provide a further voltage at least to the subregion of the adjacent doping region 123. By way of example, the further voltage can be a reference voltage (for example ground).

By way of example, the control circuit can be formed on the semiconductor substrate 120. Alternatively, the control circuit can be an external control circuit.

By way of example, the semiconductor device 100 can furthermore comprise a control circuit. The control circuit can be configured to provide electrical signals having the same signal waveform to the membrane structure 110 and the shielding doping region 122 of the semiconductor substrate 120. A minimization of parasitic capacitances between the membrane structure 110 and the shielding doping region 122 of the semiconductor substrate 120 can be achieved as a result. In addition, an improvement of a signal to noise ratio upon a detection of a capacitance or a change in a capacitance of a capacitor formed by the membrane structure 110 and the counterelectrode doping region can be achieved. By way of example, the signal waveform can be a sine wave voltage, a rectangular voltage or a sawtooth voltage.

By way of example, the suspension region 111 of the membrane structure 110 at the surface 121 of the semiconductor substrate 120 can be in contact with the shielding doping region 122. As a result, the membrane structure 110 can lie directly at the smooth surface 121 of the semiconductor substrate. It is thereby possible to prevent topography steps from being formed in the membrane region 112 of the membrane structure 110.

Alternatively, a first insulation layer can be arranged vertically between the suspension region 111 of the membrane structure 110 and the shielding doping region 122. By way of example, the first insulation layer can have an (electrical) resistivity of more than $1*10^6$ Ωcm (or more than $1*10^8$ Ωcm, more than $1*10^{10}$ Ωcm or more than $1*10^{12}$ Ωcm). By way of example, the first insulation layer can comprise at least one of silicon nitride, silicon oxide and silicon carbide.

By way of example, in the region of the cavity 130 a second insulation layer can lie at the surface 121 of the semiconductor substrate 120 or at a surface of the membrane region 112 of the membrane structure 110. It is thereby possible to avoid a shunt connection upon a contact between the membrane region 112 of the membrane structure 110 and the surface 121 of the semiconductor substrate 120 upon a deflection of the membrane region 112 of the membrane structure 110. The surface of the membrane region 112 of the membrane structure 110 can be a surface of the membrane region 112 of the membrane structure 110 that faces the cavity 130. By way of example, the first insulation layer and the second insulation layer lying at the surface 121 of the semiconductor substrate 120 can form a continuous insulation layer.

By way of example, a region having the first conductivity type can be a p doped region (for example caused by the introduction of aluminum ions or boron ions) or an n doped region (for example caused by the introduction of phosphorus ions or arsenic ions). Consequently, the second conductivity type indicates an oppositely n doped or p doped region. In other words, the first conductivity type can indicate a p type doping and the second conductivity type can indicate an n type doping, or vice versa. By way of example, an average dopant concentration of a region can be a measured number of doping atoms per unit volume averaged over the region.

By way of example, the semiconductor substrate 120 can be a silicon (Si) based semiconductor substrate. Alternatively, the semiconductor substrate 120 can be a silicon carbide (SiC) based semiconductor substrate, a gallium arsenide (GaAs) based semiconductor substrate or a gallium nitride (GaN) based semiconductor substrate. The semiconductor substrate 120 can be for example a semiconductor wafer or a semiconductor slice.

By way of example, a vertical direction, a vertical dimension or a thickness can be measured perpendicularly to the surface 121 of the semiconductor substrate 120 and a lateral direction or a lateral dimension can be measured parallel to the surface 121 of the semiconductor substrate 120. By way of example, the surface 121 of the semiconductor substrate 120 can be a front side of the semiconductor substrate 120.

A front side of the semiconductor substrate 120 can be for example a surface of the semiconductor substrate 120 on which the intention is to produce more complex structures than on a rear side of the semiconductor substrate 120, since process parameters (for example a temperature) and a treatment of the rear side may be restricted if structures have already been formed on the front side.

By way of example, the semiconductor device 100 can be a pressure sensor, an ultrasonic sensor, an ultrasonic transducer, a gas sensor, a microphone, an acceleration sensor, a Micro Electro Mechanical System (MEMS) component or a micro measuring instrument having a movable membrane construction.

Figure 2:
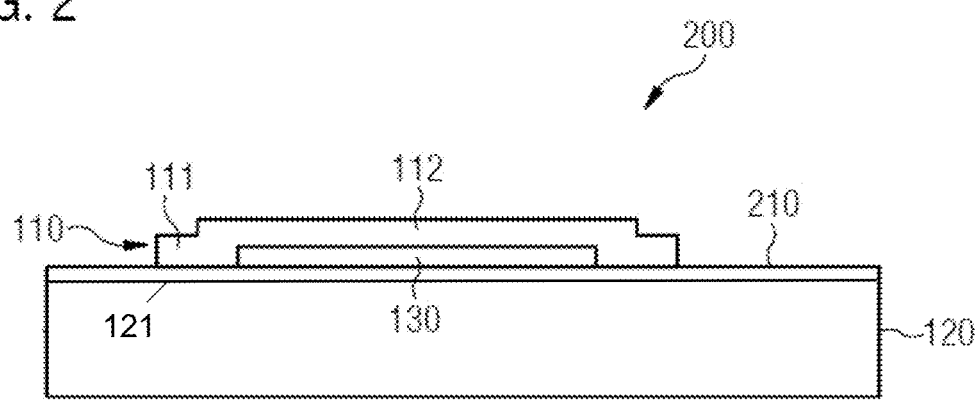
FIG. 2 shows a schematic cross section of a further semiconductor device.

FIG. 2 shows a schematic cross section of a further semiconductor device 200. The semiconductor device 200 can be configured similarly to the semiconductor device 100 described in association with FIG. 1. The semiconductor device 200 comprises a semiconductor substrate 120. An insulation layer 210 lies at a surface 121 of the semiconductor substrate 120. The insulation layer 210 completely covers the surface 121. By way of example, the insulation layer 210 can comprise a dielectric. The insulation layer 210 is moreover free of structurings and/or topologies. Moreover, the semiconductor device 200 comprises a membrane structure 110 lying at the insulation layer 210 and having a suspension region 111 and a membrane region 112. Furthermore, a cavity 130 is arranged vertically between the membrane structure 110 and the semiconductor substrate 120. By way of example, the suspension region 111 of the membrane structure 110 can lie laterally in a first part of the surface 121 of the semiconductor substrate 120, said first part being formed by a shielding doping region 122 (not depicted).

FIG. 2 shows one example of a flat membrane on account of the suspension at the substrate without a structured dielectric. By way of example, a profile of the membrane region 112 (for example of a self-supporting membrane) can be independent of a possible surface step of the insulation layer 210 (for example of a dielectric material). Therefore, it is possible to significantly increase a stability of the membrane region 112 (for example of a membrane) through the entire manufacturing sequence and the resulting yield at the wafer level can additionally be increased. Furthermore, an effective electrical insulation concept can be made possible in this example, such that a sufficient insulation from electrical potential without anchoring on dielectrics is achieved. In addition, this concept makes it possible to achieve a reduction of a parasitic capacitance and of a leakage current of the membrane structure 110 (for example of a membrane component) with respect to the semiconductor substrate 120.

By way of example, the membrane structure 110 or the membrane region 112 (for example a membrane) can be suspended at the semiconductor substrate 120 (for example an active silicon material). A thin layer of dielectric material (for example silicon nitride ($Si_3N_4$), silicon oxide ($SiO_2$) or silicon carbide (SiC)) having a thickness of approximately 10 nm to 80 nm can serve as electrical insulation between the semiconductor substrate 120 and the membrane structure 110. As a result, a membrane region 112 having a flat structure without any topology can arise in the course of a conformal membrane deposition process. Consequently, a mechanical stability of the membrane region 112 with respect to bending can be increased and an effect of specific process steps (for example chemical mechanical polishing (CMP)) can be reduced.

FIG. 2 shows one example of an optional whole area insulation layer 210 on the surface 121 of the semiconductor substrate 120 (for example a substrate surface). By way of example, the membrane structure 110 (for example a micromechanical membrane) can be applied on the semiconductor substrate 120 (for example an active substrate). By way of example, the insulation layer 210 (for example a dielectric) can be omitted in the region of the suspension region 111 (for example a membrane suspension).

FIG. 2 shows one example of a membrane without topology. By way of example, shallow trench oxides can be replaced by the insulation layer 210 (for example thin dielectric layers).

Further details and aspects will be mentioned in association with the embodiments described above or below. The embodiment shown in FIG. 2 can comprise one or more optional additional features corresponding to one or more aspects mentioned in connection with the proposed concept of one or more of the embodiments described above (for example FIG. 1) or below (for example FIGS. 3-14).

Figure 3:
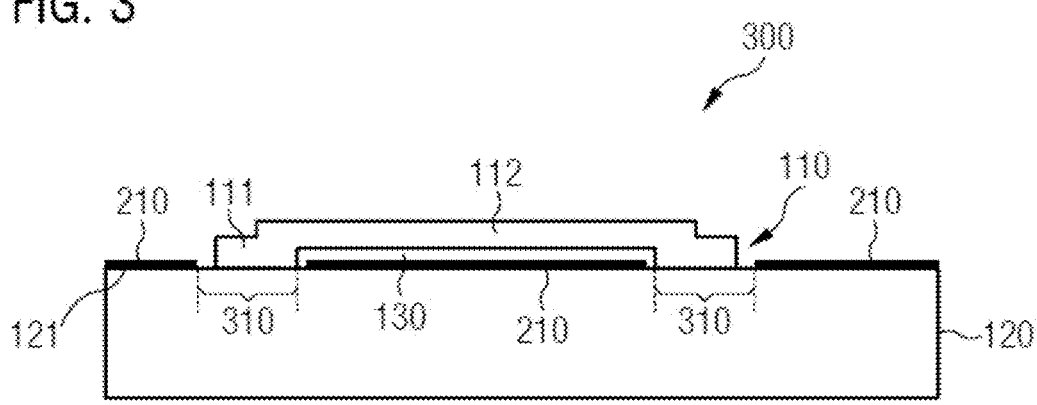
FIG. 3 shows a schematic cross section of a further semiconductor device.

FIG. 3 shows a schematic cross section of a further semiconductor device 300. The semiconductor device 300 can be configured similarly to the semiconductor device 100 described in association with FIG. 1. The semiconductor device 300 comprises a semiconductor substrate 120. A structured insulation layer 210 lies at a surface 121 of the semiconductor substrate 120. The structured insulation layer 210 covers the surface 121 with the exception of a region 310 of the surface. By way of example, the structured insulation layer 210 can comprise a dielectric. In addition, the semiconductor device 300 comprises a membrane structure 110 having a suspension region 111 and a membrane region 112. The suspension region 111 is in contact with the semiconductor substrate 120 in the region 310 of the surface 121. Furthermore, a cavity 130 is arranged vertically between the membrane structure 110 and the semiconductor substrate 120. By way of example, the suspension region 111 of the membrane structure 110 can lie laterally in a first part of the surface 121 of the semiconductor substrate 120, said first part being formed by a shielding doping region 122 (not depicted).

FIG. 3 shows one example of an optional structured insulation layer 210 on the surface 121 of the semiconductor substrate 120 (for example a substrate surface).

Further details and aspects will be mentioned in association with the embodiments described above or below. The embodiment shown in FIG. 3 can comprise one or more optional additional features corresponding to one or more aspects mentioned in connection with the proposed concept of one or more of the embodiments described above (for example FIGS. 1-2) or below (for example FIGS. 4-14).

Figure 4:
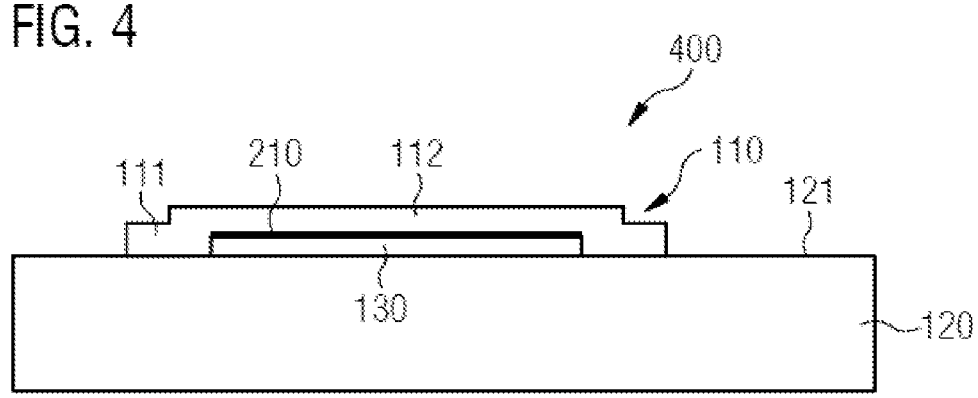
FIG. 4 shows a schematic cross section of a further semiconductor device.

FIG. 4 shows a schematic cross section of a further semiconductor device 400. The semiconductor device 400 can be configured similarly to the semiconductor device 100 described in association with FIG. 1. The semiconductor device 400 comprises a semiconductor substrate 120. In addition, the semiconductor device 400 comprises a membrane structure 110 having a suspension region 111 and a membrane region 112. The suspension region 111 is in contact with the semiconductor substrate 120. Furthermore, a cavity 130 is arranged vertically between the membrane structure 110 and the semiconductor substrate 120. In addition, an insulation layer 210 lies at a surface of the membrane region 112 that faces the cavity 130. By way of example, the insulation layer 210 can comprise a dielectric. By way of example, the suspension region 111 of the membrane structure 110 can lie laterally in a first part of the surface 121 of the semiconductor substrate 120, said first part being formed by a shielding doping region 122 (not depicted).

FIG. 4 shows one example of an optional insulation layer 210 at a membrane underside in the region of the cavity 130. By way of example, the insulation layer 210 can have a resistivity of more than $1*10^6$ Ωcm or of more than $1*10^{12}$ Ωcm. By way of example, a shielding doping region 122 can be situated in the region of the suspension region 111 (for example a membrane support). By way of example, a width of the shielding doping region 122 can be greater than a width of the suspension region 111 in order to achieve a compensation of manufacturing tolerances.

By way of example, FIG. 4 shows a semiconductor device 400 comprising a membrane structure 110. The membrane structure 110 comprises at least one suspension region 111 of the membrane structure 110. The suspension region 111 is arranged laterally in a first region of a surface 121 of a semiconductor substrate 120. Furthermore, the membrane structure 110 comprises a membrane region 112. A cavity 130 is arranged vertically between the membrane region 112 and at least one part of the semiconductor substrate 120. The suspension region laterally delimits the cavity (at least at one side of the cavity). Furthermore, the semiconductor device 400 comprises an insulation layer 210 arranged at a surface (facing the cavity) of the membrane region 112 of the membrane structure 110. Furthermore, the insulation layer 210 has a lateral extent limited to the cavity.

A vertical distance between the membrane region 112 and the surface 121 of the semiconductor substrate 120 can be for example significantly greater than (e.g. more than double the magnitude of, more than 5 times the magnitude of, or more than 10 times the magnitude of) a vertical distance between the suspension region 111 and the surface 121 of the semiconductor substrate 120.

Further details and aspects will be mentioned in association with the embodiments described above or below. The embodiment shown in FIG. 4 can comprise one or more optional additional features corresponding to one or more aspects mentioned in connection with the proposed concept of one or more of the embodiments described above (for example FIGS. 1-3) or below (for example FIGS. 5-14).

Figure 5:
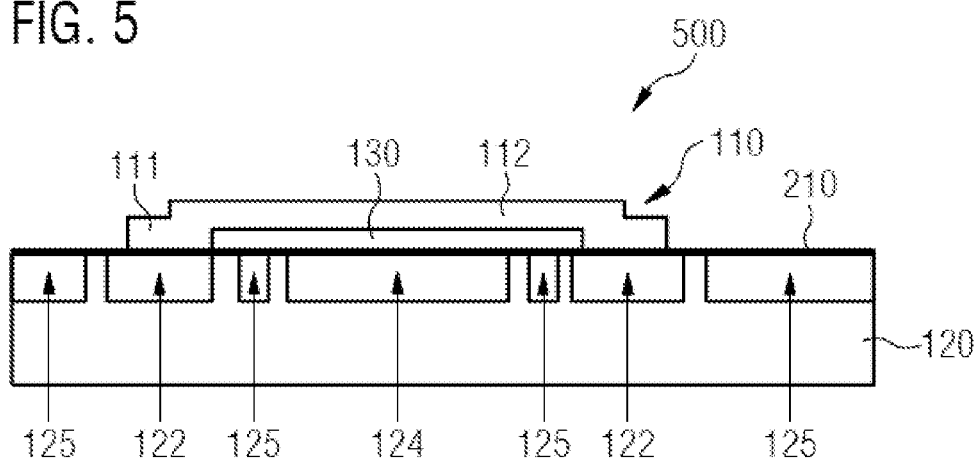
FIG. 5 shows a schematic cross section of a further semiconductor device.

FIG. 5 shows a schematic cross section of a further semiconductor device 500. The semiconductor device 500 can be configured similarly to the semiconductor device 100 described in association with FIG. 1. The semiconductor device 500 comprises a semiconductor substrate 120. An insulation layer 210 lies at a surface 121 of the semiconductor substrate 120. The insulation layer 210 completely covers the surface 121. By way of example, the insulation layer 210 can comprise a dielectric. The insulation layer 210 is free of structurings and/or topologies. In addition, the semiconductor device 500 comprises a membrane structure 110 lying at the insulation layer 210 and having a suspension region 111 and a membrane region 112. Furthermore, a cavity 130 is arranged vertically between the membrane structure 110 and the semiconductor substrate 120. Furthermore, the suspension region 111 lies laterally in a first region of the surface 121 of the semiconductor substrate, said first region being formed by a shielding doping region 122. In addition, in the region of the cavity 130 a second part of the surface 121 of the semiconductor substrate 120 is formed by a counterelectrode doping region 124. A subregion 125 of an adjacent doping region 123 lies laterally between the shielding doping region 122 and the counterelectrode doping region 124. The adjacent doping region 123 is formed by a bulk doping region of the semiconductor substrate 120.

By way of example, the shielding doping region 122, the counterelectrode doping region 124 and/or the subregion 125 of the adjacent doping region 123 can be implantation regions. The shielding doping region 122 and the counterelectrode doping region 124 can be formed for example during an implantation step in the semiconductor substrate. Alternatively, the shielding doping region 122, the counterelectrode doping region 124 and/or the subregion 125 of the adjacent doping region 123 can be formed by diffusion.

FIG. 5 shows one example of a doping scheme of an improved membrane suspension approach. By way of example, the membrane structure 110 (for example a membrane) can carry an electrical potential, while a region of the semiconductor substrate 120 below the membrane structure 110 (for example the counterelectrode doping region 124) carries the opposite potential. The region can be defined by an implantation process with opposite charge with respect to the doping of the semiconductor substrate 120 (p-type implantation vis-à-vis n type semiconductor substrate or n-type implantation vis-à-vis p-type semiconductor substrate). The counterelectrode doping region 124 can have a doping concentration of $10^{18}$ atoms per cm$^3$ or higher (for example up to $10^{21}$ atoms per cm$^3$). An insulation between the counterelectrode doping region 124 (for example an implanted region) and the surrounding semiconductor substrate 120 can be achieved by means of a p-n junction formed by the counterelectrode doping region 124 and a second implantation, the subregion 125 of the adjacent region 123. Therefore, for the subregion 125 of the adjacent region 123 it is possible to use the opposite dopant charge in comparison with the counterelectrode doping region 124 having a concentration of $1*10^{18}$ atoms per cm$^3$ or higher (for example up to $1*10^{21}$ atoms per cm$^3$). For a reduced leakage it is possible to arrange a spacing having an intrinsic doping concentration of the semiconductor substrate 120 having a concentration of approximately $10^{15}$ to $10^{16}$ atoms per cm$^3$ between the counterelectrode doping region 124 and the subregion 125 of the adjacent region 123, as shown in FIG. 5. In order to minimize the electrical capacitance of the membrane structure 110 with respect to the semiconductor substrate 120, an (optional) shielding doping region 122 can be introduced at the suspension region 111 (for example at suspension sides) of the membrane structure 110. The dopant type and the concentration can be similar to those of the counterelectrode doping region 124. The electrical insulation of the shielding doping region 122 with respect to the semiconductor substrate 120 can be achieved in a manner similar to that in the case of the counterelectrode doping region 124, wherein it is possible to form a p-n junction having an optional, intrinsically doped spacing therebetween. By way of example, the subregion 125 of the adjacent region 123 can be supported by implantations having a lower dose of the same charge and a concentration between those of the counterelectrode doping region 124 and of the subregion 125 of the adjacent region 123, in order to further suppress a leakage current.

FIG. 5 shows one example of an implantation scheme. By way of example, it is possible to achieve a formation of p-n junctions in order to achieve an electrical insulation at suspension sides of the membrane structure 110 or a membrane (oppositely biased). The implantation scheme (p/n) can be produced for example by means of implantation processes, which are typically used in complementary metal oxide semiconductor (CMOS) production. As a result, a parasitic capacitance can be reduced and an improved signal to noise ratio can be achieved.

By way of example, the counterelectrode doping region 124 can be an implantation region that forms an active electrode in the semiconductor substrate. The subregion 125 of the adjacent doping region 124 can be for example an implantation region that serves for shielding (for example system ground). By way of example, the shielding doping region 122 can be an implantation region for insulation and reduction of a parasitic capacitance.

Further details and aspects will be mentioned in association with the embodiments described above or below. The embodiment shown in FIG. 5 can comprise one or more optional additional features corresponding to one or more aspects mentioned in connection with the proposed concept or one or more of the embodiments described above (for example FIGS. 1-4) or below (for example FIGS. 6-14).

Figure 6:
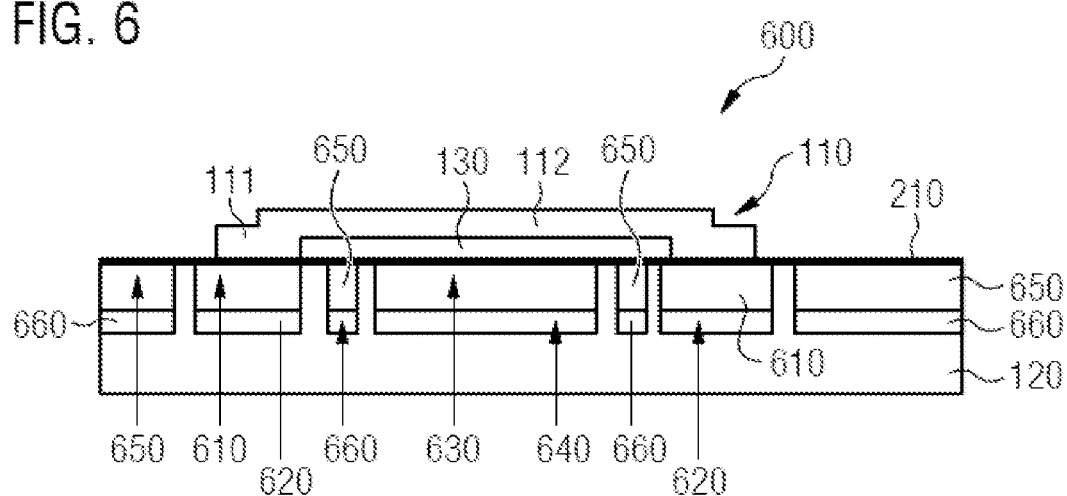
FIG. 6 shows a schematic cross section of a further semiconductor device.

FIG. 6 shows a schematic cross section of a further semiconductor device 600. The semiconductor device 600 can be configured similarly to the semiconductor device 500 described in association with FIG. 5. In the case of the semiconductor device 600, the shielding doping region 122 is subdivided into a first subregion 610 and a second subregion 620 lying below the latter. In addition, the counterelectrode doping region 124 is divided into a first subregion 630 and a second subregion 640 lying below the latter. Furthermore, the subregion 125 of the adjacent region 123 is divided into a first subregion 650 and a second subregion 660 lying below the latter.

By way of example, the subregions 610 and 630 can have a dopant concentration of more than $1*10^{17}$ atoms per cm$^3$ and less than $1*10^{21}$ atoms per cm$^3$. The subregions 610 and 630 can have for example a dopant concentration of typically $1*10^{20}$ atoms per cm$^3$. By way of example, the subregions 610 and 630 can have an implant depth of less than or equal to 200 nm.

By way of example, the subregion 620 and 640 can have a dopant concentration of more than $1*10^{16}$ atoms per cm$^3$ and less than $1*10^{18}$ atoms per cm$^3$. The subregions 620 and 640 can have for example a dopant concentration of typically $1*10^{17}$ atoms per cm$^3$. By way of example, the subregions 620 and 640 can have an implant depth of less than or equal to 1000 nm. The subregions 620 and 640 can be optional, for example.

By way of example, the subregion 650 can have a dopant concentration of more than $1*10^{17}$ atoms per cm$^3$ and less than $1*10^{21}$ atoms per cm$^3$. The subregion 650 can have for example a dopant concentration of typically $1*10^{20}$ atoms per cm$^3$. By way of example, the subregion 650 can have an implant depth of less than or equal to 100 nm.

By way of example, the subregion 660 can have a dopant concentration of more than $1*10^{16}$ atoms per cm$^3$ and less than $1*10^{18}$ atoms per cm$^3$. The subregion 660 can have for example a dopant concentration of typically $5*10^{17}$ atoms per cm$^3$. By way of example, the subregion 660 can have an implant depth of less than or equal to 1000 nm. The subregion 660 can be optional, for example.

By way of example, the first subregion 650 of the adjacent doping region is arranged vertically between the surface of the semiconductor substrate 120 and the second subregion 660 of the adjacent doping region. Furthermore, by way of example, the subregion 650 of the adjacent doping region and the second subregion 660 of the adjacent doping region are arranged laterally between the shielding doping region and a counterelectrode doping region. As a result, by way of example a lateral electrical insulation between the shielding doping region and the counterelectrode doping region can be improved.

Further details and aspects will be mentioned in association with the embodiments described above or below. The embodiment shown in FIG. 6 can comprise one or more optional additional features corresponding to one or more aspects mentioned in connection with the proposed concept or one or more of the embodiments described above (for example FIGS. 1-5) or below (for example FIGS. 7-14).

Figure 7:
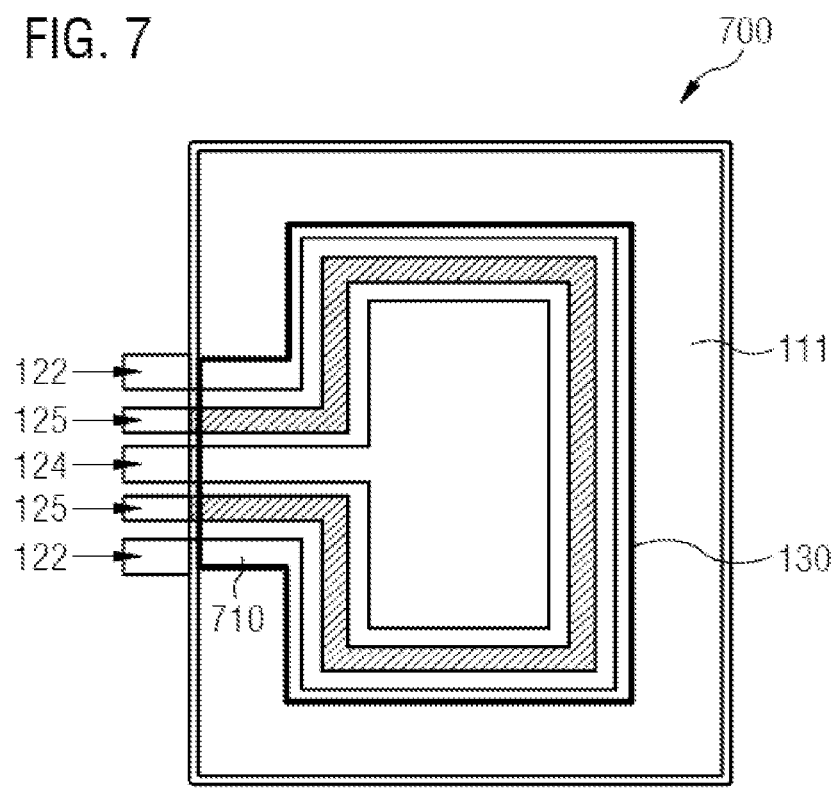
FIG. 7 shows a schematic plan view of a part of a further semiconductor device.

FIG. 7 shows a schematic plan view of a part of a further semiconductor device 700. The semiconductor device 700 can be configured similarly to the semiconductor device 100 described in association with FIG. 1 or similarly to the semiconductor device 600 described in association with FIG. 6. The semiconductor device 700 comprises a semiconductor substrate having the shielding doping region 122, the counterelectrode doping region 124 and a subregion 125 of the adjacent region 123. The subregion 125 of the adjacent region 123 can be divided for example into the subregions 650 and 660. Furthermore, FIG. 7 depicts the cavity 130 below the membrane region 112 of the membrane structure 110. In addition, the membrane structure 110 has an edge having a feedthrough part 710 in the suspension region 111. The cavity 130 extends into the region of the feedthrough part 710.

FIG. 7 shows one example of a lateral feedthrough of the counterelectrode doping region 124 in the region of an access for removing a sacrificial layer. By way of example, a parasitic capacitance between the counterelectrode doping region 124 and the membrane structure 110 can be reduced by a cavity above the lateral through contact or in the region of the feedthrough part 710. The cavity above the lateral through contact or in the region of the feedthrough part 710 may for example be optional and not be necessary for a lateral feedthrough. By way of example, the subregion 125 of the adjacent region 123 may be present for the purpose of lateral shielding.

By way of example, an electrical contacting can be effected by means of vertical VIA structures. A membrane contact can lie for example in the region of the suspension region 111 (for example a membrane support). By way of example, a superficial, lateral feedthrough can be present. Alternatively, a lateral feedthrough in deeper planes of the semiconductor substrate can be made possible with the use of alternative implantations. For this purpose, it is possible to carry out a near surface implant having a depth of approximately 100 nm or a deep alternative process having a depth of approximately 600 nm.

By way of example, the membrane structure 110 and/or the membrane region 112 can have an arbitrary shape and/or an arbitrary aspect ratio. The membrane structure 110, the membrane region 112, the shielding doping region 122, the counterelectrode doping region 124 and/or the subregion 125 of the adjacent region 123 can have for example an arbitrary geometry and/or positioning.

Further details and aspects will be mentioned in association with the embodiments described above or below. The embodiment shown in FIG. 7 can comprise one or more optional additional features corresponding to one or more aspects mentioned in connection with the proposed concept of one or more of the embodiments described above (for example FIGS. 1-6) or below (for example FIGS. 8-14).

Figure 8:
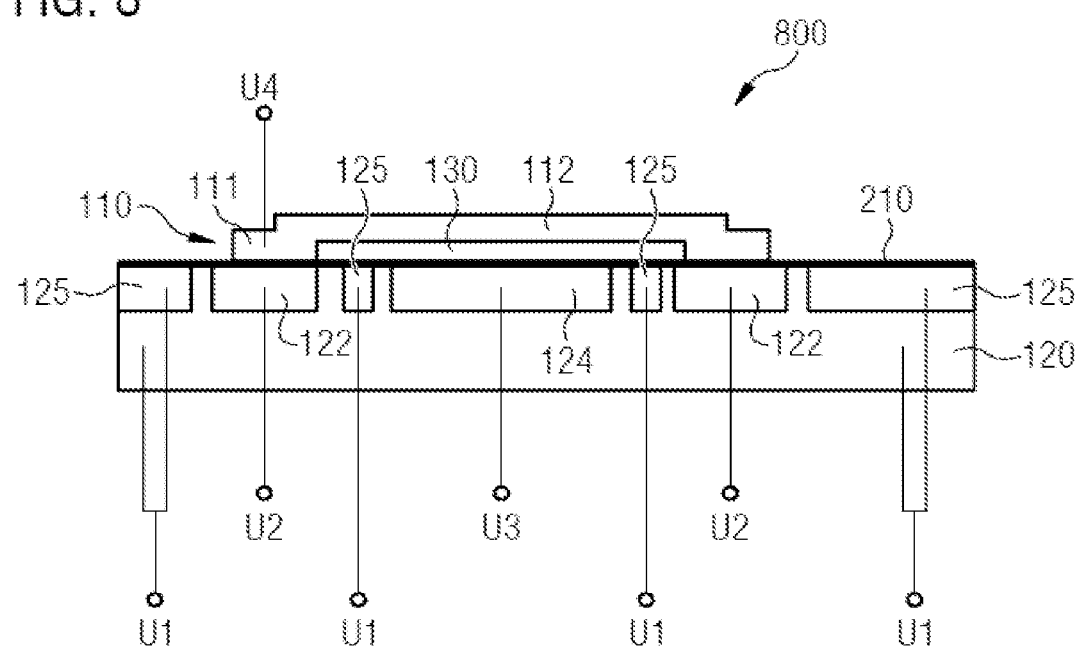
FIG. 8 shows a schematic cross section of a further semiconductor device.

FIG. 8 shows a schematic cross section of a further semiconductor device 800. The semiconductor device 800 can be configured similarly to the semiconductor device 500 described in association with FIG. 5. A voltage signal U1 is applied to the subregion 125 of the adjacent region 123 and to the semiconductor substrate 120. In addition, a voltage signal U2 is applied to the shielding doping region 122.

Furthermore, a voltage signal U3 is applied to the counterelectrode doping region 124. Furthermore, a voltage signal U4 is applied to the membrane structure 110.

FIG. 8 shows one example of a contacting. By way of example, in order to satisfy requirements for an insulation, as operating mode in the case of an adjacent doping region 123 formed by a p-doped bulk doping region (for example a substrate) or an adjacent doping region 123 formed by a p-doped well implant, it is possible to choose the voltage signals as U1≤U3 and U1≤U2. By way of example, in order to satisfy the requirements for an insulation, as operating mode in the case of an adjacent doping region 123 formed by an n-doped bulk doping region (for example a substrate) or an adjacent doping region 123 formed by an n doped well implant, it is possible to choose the voltage signals as U1≥U3 and U1≥U2.

By way of example, a minimization of parasitic capacitances can be achieved in the case U2=U4. By way of example, in the case where the voltage signal U2 has the same signal waveform as the voltage signal U4, without influencing a subsequent signal processing, it is possible to achieve a minimization of parasitic capacitances and an improvement of a signal to noise ratio.

Further details and aspects will be mentioned in association with the embodiments described above or below. The embodiment shown in FIG. 8 can comprise one or more optional additional features corresponding to one or more aspects mentioned in connection with the proposed concept of one or more of the embodiments described above (for example FIGS. 1-7) or below (for example FIGS. 9-14).

Figure 9:
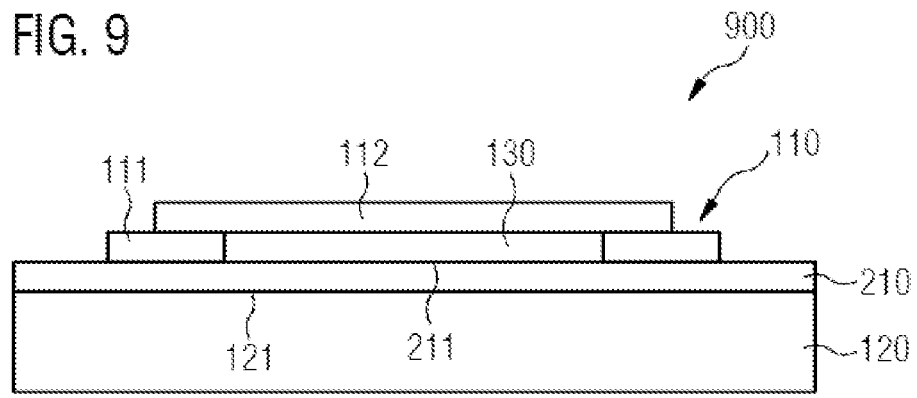
FIG. 9 shows a schematic cross section of a further semiconductor device.

FIG. 9 shows a schematic cross section of a further semiconductor device 900. The semiconductor device 900 comprises at least one suspension region 111 of a membrane structure 110. The suspension region 111 lies laterally in a first region of a surface 121 of a semiconductor substrate 120. In addition, an insulation layer 210 is arranged vertically between the suspension region 111 of the membrane structure 110 and the first region of the surface 121 of the semiconductor substrate 120. Furthermore, the semiconductor device 900 comprises a membrane region 112 of the membrane structure 110. A cavity 130 is arranged vertically between the membrane region 112 and at least one part of the semiconductor substrate 120. In addition, a maximum vertical distance between points at an edge area of the cavity 130 that faces the semiconductor substrate 120 is less than 10 nm (or less than 5 nm or less than 2 nm).

The insulation layer 210 arranged vertically between the suspension region 111 of the membrane structure 110 and the first region of the surface 121 of the semiconductor substrate 120 makes it possible to bring about an electrical insulation of the membrane structure 110 from further regions of the semiconductor substrate 120 (for example from a counterelectrode doping region of the semiconductor substrate 120 or from a bulk region of the semiconductor substrate 120). It is thereby possible to reduce a parasitic capacitance between the membrane structure no and the further regions of the semiconductor substrate 120. As a result, a capacitance between the membrane region 112 and a counterelectrode doping region of the semiconductor substrate 120 can be detected with an improved signal-to noise ratio. As a result, the membrane structure 110 can have improved electrical properties. In addition, by virtue of the fact that the maximum distance between points at the edge area of the cavity 130 that faces the semiconductor substrate 120 is less than 10 nm, a topography step below the membrane structure 110 can be obviated. Obviating the topography step below the membrane structure 110 makes it possible to avoid transferring the topography step to the membrane region 112 of the membrane structure 110 (for example during a deposition of the membrane structure 110). As a result, an influencing of mechanical properties of the membrane structure 110 (for example stiffness or natural frequency of the membrane region 112) by a topography step transferred to the membrane region 112 can be avoided. As a result, a fluctuation of a behavior of semiconductor devices 900 within a production batch can be reduced and/or structural weak points in the membrane structure 110 can be avoided and a yield can thereby be increased. The semiconductor device 900 can be provided more cost effectively as a result. In addition, obviating the topography step transferred to the membrane region 112 makes it possible to avoid bending of the membrane region 112 in the direction of the surface 121 of the semiconductor substrate 120 and thus fixing of the membrane region 112 to the surface 121 of the semiconductor substrate 120 during chemical mechanical polishing of the semiconductor device 900. As a result, it is possible to increase a yield in production of the semiconductor device 900. The semiconductor device 900 can be provided more cost effectively as a result.

By way of example, a lateral dimension of the edge area of the cavity 130 facing the semiconductor substrate 120 can be more than 90% (or more than 95% or more than 99%) of a lateral dimension of the cavity 130. The edge area of the cavity 130 that faces the semiconductor substrate 120 can have for example the same geometric dimensions as a lateral cross section of the cavity 130 in the region of a transition between the suspension region 111 of the membrane structure 110 and the insulation layer 210. By way of example, the edge area of the cavity 130 that faces the semiconductor substrate 120 can be formed by a surface 211 of the insulation layer 210 that faces the membrane structure 110 or the cavity 130. The insulation layer 210 can for example completely cover the surface 121 of the semiconductor substrate 120 in the region of the cavity 130.

By way of example, the membrane structure 110 can be configured like the membrane structure described in association with FIG. 1. The semiconductor substrate 120 can be configured for example like the semiconductor substrate described in association with FIG. 1. By way of example, the insulation layer 210 can be configured like the insulation layer described in association with FIG. 1 or like that described in association with FIG. 2.

By way of example, the semiconductor device 900 can be a pressure sensor, an ultrasonic sensor, an ultrasonic transducer, a gas sensor, a microphone, an acceleration sensor, a Micro Electro Mechanical System (MEMS) component or a micro measuring instrument having a movable membrane construction.

Further details and aspects will be mentioned in association with the embodiments described above or below. The embodiment shown in FIG. 9 can comprise one or more optional additional features corresponding to one or more aspects mentioned in connection with the proposed concept of one or more of the embodiments described above (for example FIGS. 1-8) or below (for example FIGS. 10-14).

Figure 10:
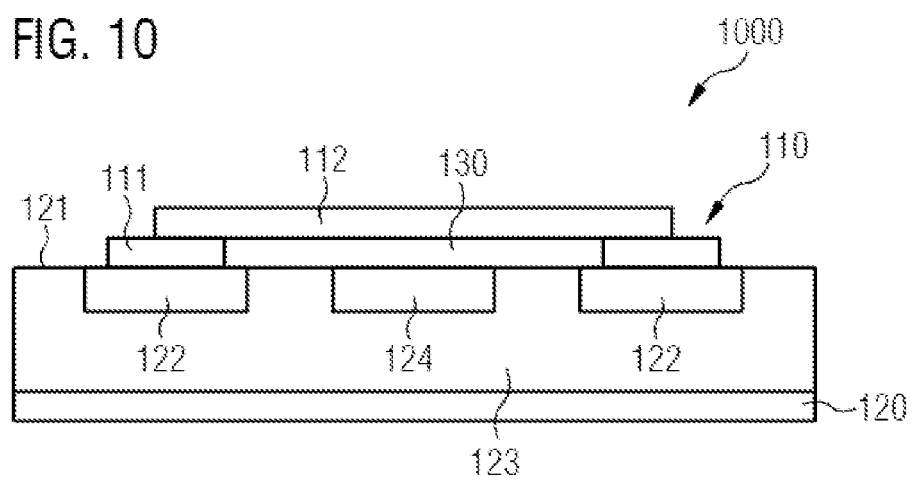
FIG. 10 shows a schematic cross section of a part of a pressure sensor.

FIG. 10 shows a schematic cross section of a part of a pressure sensor 1000. The pressure sensor 1000 comprises a semiconductor device. The semiconductor device can be configured like the semiconductor device 100 described in association with FIG. 1 or like the semiconductor device 900 described in association with FIG. 9. In addition, a semiconductor substrate 120 of the pressure sensor 1000 comprises a counterelectrode doping region 124. A membrane region 112 of a membrane structure 110 of the pressure sensor 1000 and the counterelectrode doping region 124 can form a capacitor, for example. As a result of a pressure being exerted on the membrane region 112, the latter can be deformed and a capacitance of the capacitor can be altered as a result. By detecting the capacitance or a change in the capacitance of the capacitor, it is possible to determine the pressure exerted on the membrane region 112. By way of example, the pressure sensor 1000 can comprise an evaluation circuit for determining the exerted pressure on the basis of the detected capacitance or the detected change in the capacitance.

Further details and aspects will be mentioned in association with the embodiments described above or below. The embodiment shown in FIG. 10 can comprise one or more optional additional features corresponding to one or more aspects mentioned in connection with the proposed concept or one or more of the embodiments described above (for example FIGS. 1-9) or below (for example FIGS. 11-14).

Figure 11:
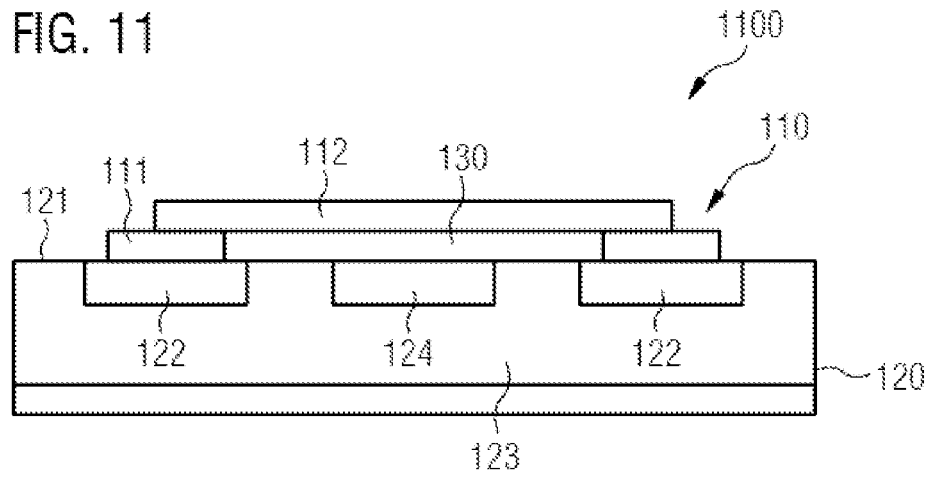
FIG. 11 shows a schematic cross section of a part of a microphone.

FIG. 11 shows a schematic cross section of a part of a microphone 1100. The microphone 1100 comprises a semiconductor device. The semiconductor device can be configured like the semiconductor device 100 described in association with FIG. 1 or like the semiconductor device 900 described in association with FIG. 9. In addition, a semiconductor substrate 120 of the microphone 1100 comprises a counterelectrode doping region 124. A membrane region 112 of a membrane structure 110 of the microphone 1100 and the counterelectrode doping region 124 can form a capacitor, for example. Upon soundwaves impinging on the membrane region 112, the latter can be deformed and a capacitance of the capacitor can be altered as a result. By detecting the capacitance or a change in the capacitance of the capacitor, it is possible to generate an electrical signal representing the soundwaves impinging on the membrane region 112. By way of example, the microphone 1100 can comprise an evaluation circuit for determining the electrical signal on the basis of the detected capacitance or the detected change in the capacitance.

Further details and aspects will be mentioned in association with the embodiments described above or below. The embodiment shown in FIG. 11 can comprise one or more optional additional features corresponding to one or more aspects mentioned in connection with the proposed concept of one or more of the embodiments described above (for example FIGS. 1-10) or below (for example FIGS. 12-14).

Figure 12:
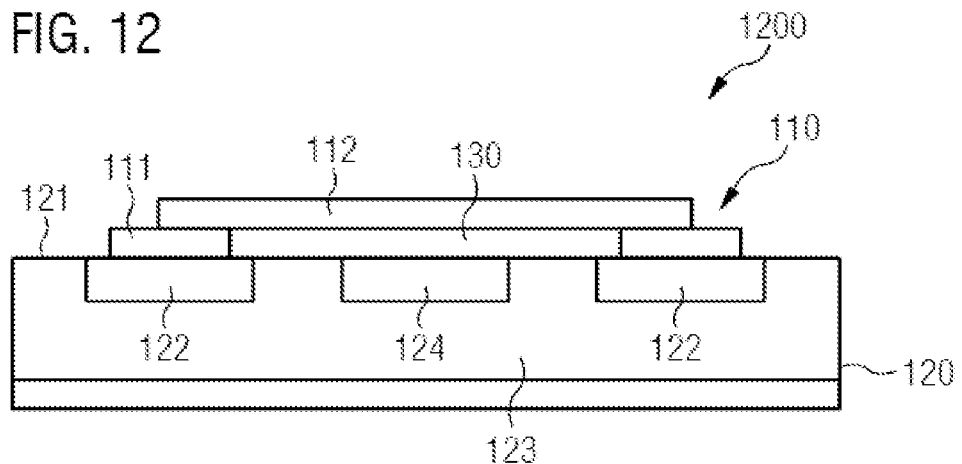
FIG. 12 shows a schematic cross section of a part of an acceleration sensor.

FIG. 12 shows a schematic cross section of a part of an acceleration sensor 1200. The acceleration sensor 1200 comprises a semiconductor device. The semiconductor device can be configured like the semiconductor device 100 described in association with FIG. 1 or like the semiconductor device 900 described in association in FIG. 9. In addition, a semiconductor substrate 120 of the acceleration sensor 1200 comprises a counterelectrode doping region 124. A membrane region 1200 of a membrane structure 110 of the acceleration sensor 1200 and the counterelectrode doping region 124 can form a capacitor, for example. Upon an acceleration of the acceleration sensor 1200, the membrane region 112 of the membrane structure 110 can be deformed and a capacitance of the capacitor can be altered as a result. By detecting the capacitance or a change in the capacitance of the capacitor, it is possible to determine the acceleration of the acceleration sensor 1200. By way of example, the acceleration sensor 1200 can comprise an evaluation circuit for determining the acceleration on the basis of the detected capacitance or the detected change in the capacitance.

Further details and aspects will be mentioned in association with the embodiments described above or below. The embodiment shown in FIG. 12 can comprise one or more optional additional features corresponding to one or more aspects mentioned in connection with the proposed concept of one or more of the embodiments described above (for example FIGS. 1-11) or below (for example FIGS. 13-14).

Figure 13:
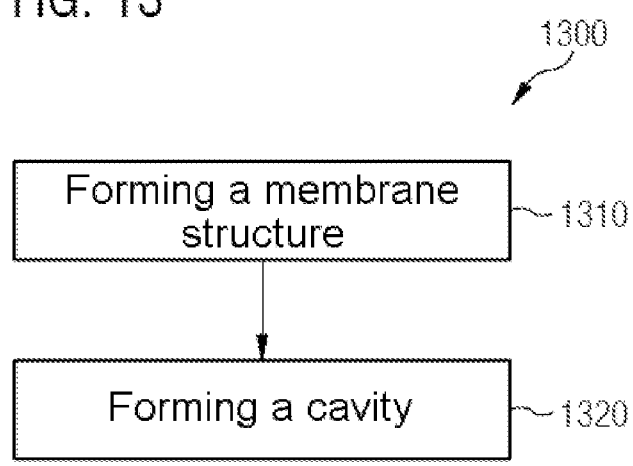
FIG. 13 shows a flow diagram of a method for forming a semiconductor device.

FIG. 13 shows a flow diagram of a method 1300 for forming a semiconductor device. The method 1300 comprises forming 1310 a membrane structure 110. The membrane structure no comprises a membrane region 112 and at least one suspension region 111. In addition, the suspension region 111 lies laterally in a first region of a surface 121 of a semiconductor substrate 120. Furthermore, the method 1300 comprises forming 1320 a cavity 130 vertically between the membrane region 112 and at least one part of the semiconductor substrate 120. The first region of the surface 121 of the semiconductor substrate 120 is formed by a surface of a shielding doping region 122 of the semiconductor substrate 120. In addition, the shielding doping region 122 of the semiconductor substrate 120 adjoins an adjacent doping region 123. Furthermore, the adjacent doping region 123 forms at least one part of the surface 121 of the semiconductor substrate 120 in the region of the cavity 130. Furthermore, the adjacent doping region 123 has a first conductivity type and the shielding doping region 122 has a second conductivity type.

By virtue of the different conductivity types of the shielding doping region 122 and of the adjacent doping region 123, a p-n junction can be formed at a junction between the shielding doping region 122 and the adjacent doping region 123. As a result, a depletion layer can be produced at the junction between the shielding doping region 122 and the adjacent doping region 123. The depletion layer produced can bring about an electrical insulation of the suspension region 111 and thus of the entire membrane structure 110 from further regions of the semiconductor substrate 120 (for example from a counterelectrode doping region 124 of the semiconductor substrate 120 or from a bulk region of the semiconductor substrate 120). It is thereby possible to reduce a parasitic capacitance between the membrane structure 110 and the further regions of the semiconductor substrate 120. As a result, a capacitance between the membrane region 112 and a counterelectrode doping region of the semiconductor substrate 120 can be detected with an improved signal to noise ratio. As a result, the membrane structure 110 can have improved electrical properties. As a result, moreover, a structured insulation element (for example a structured dielectric) lying between the membrane suspension 111 and the surface 121 of the semiconductor substrate 120 and thus a topography step below the membrane structure 110 can be obviated. Obviating the topography step below the membrane structure 110 makes it possible to avoid transferring the topography step to the membrane region 112 of the membrane structure 110 (for example during a deposition of the membrane structure 110). As a result, an influencing of mechanical properties of the membrane structure 110 (for example stiffness or natural frequency of the membrane region 112) by a topography step transferred to the membrane region 112 can be avoided. As a result, a fluctuation of a behavior of semiconductor devices within a production batch can be reduced and/or structural weak points in the membrane structure 110 can be avoided and a yield can thereby be increased. The semiconductor device can be provided more cost effectively as a result. In addition, obviating the topography step transferred to the membrane region 112 makes it possible to avoid bending of the membrane region 112 in the direction of the surface 121 of the semiconductor substrate 120 and thus fixing of the membrane region 112 to the surface 121 of the semiconductor substrate 120 during chemical mechanical polishing of the semiconductor device. As a result, it is possible to increase a yield in production of the semiconductor device. The semiconductor device can be provided more cost effectively as a result.

By way of example, forming 1310 the membrane structure 110 can comprise depositing a sacrificial layer (for example a carbon layer) and a semiconductor layer (for example a boron doped silicon layer) and structuring the deposited semiconductor layer. The membrane structure 110 can be formed monolithically, for example. Forming 1320 the cavity 130 can comprise for example removing the sacrificial layer below the membrane region 112 of the membrane structure 110 by etching. By way of example, the membrane structure 110 can have a lateral and/or a vertical opening for removing the sacrificial layer.

By way of example, the semiconductor device 100 described in association with FIG. 1 can be formed by means of the method 1300.

Further details and aspects will be mentioned in association with the embodiments described above or below. The embodiment shown in FIG. 13 can comprise one or more optional additional features corresponding to one or more aspects mentioned in connection with the proposed concept of one or more of the embodiments described above (for example FIGS. 1-12) or below (for example FIG. 14).

Figure 14:
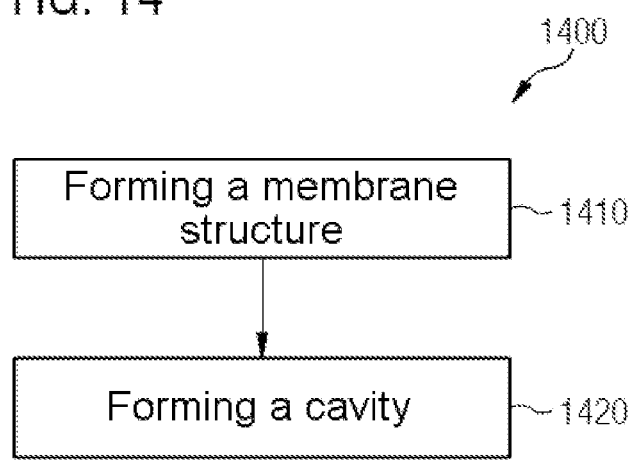
FIG. 14 shows a flow diagram of a further method for forming a semiconductor device.

FIG. 14 shows a flow diagram of a further method 1400 for forming a semiconductor device. The method 1400 comprises forming 1410 a membrane structure 110. The membrane structure 110 comprises a membrane region 112 and at least one suspension region 111. In addition, the suspension region 111 lies laterally in a first region of a surface 121 of a semiconductor substrate 120. Furthermore, an insulation layer 210 is arranged vertically between the suspension region 111 of the membrane structure 110 and the first region of the surface 121 of the semiconductor substrate 120. Furthermore, the method 1400 comprises forming 1420 a cavity 130 vertically between the membrane region 112 and at least one part of the semiconductor substrate 120. A maximum vertical distance between points at an edge area of the cavity 130 that faces the semiconductor substrate 120 is less than 10 nm (or less than 5 nm or less than 2 nm).

The insulation layer 210 arranged vertically between the suspension region 111 of the membrane structure 110 and the first region of the surface 121 of the semiconductor substrate 120 makes it possible to bring about an electrical insulation of the membrane structure 110 from further regions of the semiconductor substrate 120 (for example from a counterelectrode doping region of the semiconductor substrate 120 or from a bulk region of the semiconductor substrate 120). It is thereby possible to reduce a parasitic capacitance between the membrane structure no and the further regions of the semiconductor substrate 120. As a result, a capacitance between the membrane region 112 and a counterelectrode doping region of the semiconductor substrate 120 can be detected with an improved signal-to noise ratio. As a result, the membrane structure 110 can have improved electrical properties. In addition, by virtue of the fact that the maximum vertical distance between points at the edge area of the cavity 130 that faces the semiconductor substrate is less than 10 nm, a topography step below the membrane structure no can be obviated. Obviating the topography step below the membrane structure 110 makes it possible to avoid transferring the topography step to the membrane region 112 of the membrane structure 110 (for example during a deposition of the membrane structure 110). As a result, an influencing of mechanical properties of the membrane structure 110 (for example stiffness or natural frequency of the membrane region 112) by a topography step transferred to the membrane region 112 can be avoided. As a result, a fluctuation of a behavior of semiconductor devices 110 within a production batch can be reduced and/or structural weak points in the membrane structure 110 can be avoided and a yield can thereby be increased. The semiconductor device can be provided more cost effectively as a result. In addition, obviating the topography step transferred to the membrane region 112 makes it possible to avoid bending of the membrane region 112 in the direction of the surface 121 of the semiconductor substrate 120 and thus fixing of the membrane region 112 to the surface 121 of the semiconductor substrate 120 during chemical mechanical polishing of the semiconductor device. As a result, it is possible to increase a yield in production of the semiconductor device. The semiconductor device can be provided more cost effectively as a result.

By way of example, forming 1410 the membrane structure 110 can comprise depositing a sacrificial layer (for example a carbon layer) and a semiconductor layer (for example a boron-doped silicon layer) and structuring the deposited semiconductor layer. The membrane structure 110 can be formed monolithically, for example. Forming 1420 the cavity 130 can comprise for example removing the sacrificial layer below the membrane region 112 of the membrane structure 110 by etching. By way of example, the membrane structure 110 can have a lateral and/or a vertical opening for removing the sacrificial layer.

By way of example, the semiconductor device 900 described in association with FIG. 9 can be formed by means of the method 1400.

Further details and aspects will be mentioned in association with the embodiments described above or below. The embodiment shown in FIG. 14 can comprise one or more optional additional features corresponding to one or more aspects mentioned in connection with the proposed concept of one or more of the embodiments described above (for example FIGS. 1-13) or below.

Some embodiments relate to a monolithically integrated membrane construction having improved mechanical stability.

In accordance with one aspect, in the case of a monolithically integrated approach, mechanical and electrical parts can be integrated on a common piece of semiconductor substrate or silicon. In this case, it is possible to achieve a higher degree of miniaturization cost reduction on account of the handling of only one chip.

In accordance with one aspect, in the course of forming a semiconductor device, an additional burden for the MEMS production sequence can occur on account of FEOL restrictions.

In accordance with one aspect, pressure sensors may be large volume products for automotive and consumer applications. Advancing miniaturization may lead to systems having extremely small dimensions in the range of a few 10 micrometers. These components may have an excellent sensitivity down to pascal values. On the other hand, small disturbances of the pressure sensitive membrane may lead to astonishing measurement errors. These deviations may stem from the integration technology in which a specific topology is not completely suppressed. These topological effects may be transferred to the membrane by conformal deposition processes and thus influence the mechanical behavior of the component.

In accordance with one aspect, the integration of pressure sensors into cellular phones, portable appliances, bicycles, drones or autonomous vehicles may be supported by means of the semiconductor device. Height limitations may be reduced significantly below 10 millimeters at the present time and continuously in the near future. Increasing the stability of the self-supporting membrane may considerably increase the performance and reduce the signal to noise ratio (SNR) of such components, which may allow an improved height resolution and temperature stability.

In accordance with one aspect, in order to form the semiconductor device it is possible to use an approach of anchoring the membrane influenced by pressure on the active silicon surface, in the case of which approach deep dielectrics, for example shallow trench oxides (referred to as "shallow trench isolation", STI), may be obviated. In addition, an implantation scheme may be introduced which may allow the minimization of leakage current and parasitic capacitances, as a result of which the sensor behavior may thus be improved.

In accordance with one aspect, measurement values of the capacitance between membrane and counterelectrode (for example of the semiconductor device) may exhibit a reduced capacitance value compared with conventional designs.

In accordance with one aspect, a suspension concept (for example of the membrane structure) may be detected by a top down image generated by means of a scanning electron microscope (SEM).

In accordance with one aspect, implantation profiles and dopant type (for example n type versus p type implantation) may be detected and/or measured by mapping by means of scanning capacitance microscopy (referred to as "scanning capacitance mapping", SCM) and/or mapping by means of "scanning spreading resistance microscopy" (referred to as "scanning spreading resistance mapping", SSRM).

Advantageous aspects of some embodiments include a membrane with improved electrical properties, increased lifetime and/or an improved reliability.

The features disclosed in the description above, the following claims and the accompanying figures may be of importance and implemented both individually and in any desired combination for the realization of an exemplary embodiment in the various configurations thereof.

Although some aspects have been described in association with a device, it goes without saying that these aspects also constitute a description of the corresponding method, such that a block or a component of a device should also be understood as a corresponding method step or as a feature of a method step. Analogously thereto, aspects that have been described in association with or as a method step also constitute a description of a corresponding block or detail or feature of a corresponding device.

Generally, exemplary embodiments of the present invention may be implemented as a program, firmware, a computer program or a computer program product comprising a program code or as data, wherein the program code or the data is or are effective for carrying out one of the methods when the program runs on a processor or a programmable hardware component. The program code or the data may for example also be stored on a machine readable carrier or data carrier. The program code or the data may be present, inter alia, as source code, machine code or byte code and as other intermediate code. The data carrier may be a digital storage medium, a magnetic storage medium, for example a floppy disk, a magnetic tape, or a hard disk, or an optically readable digital storage medium. A programmable hardware component may be formed by a processor, a central processing unit (CPU), a graphics processing unit (GPU), a computer, a computer system, an application specific integrated circuit (ASIC), an integrated circuit (IC), a system on chip (SOC), a programmable logic element or a field programmable gate array (FPGA) with a microprocessor.

Only the principles of the disclosure are presented by the description and drawings. It therefore goes without saying that the person skilled in the art may derive different arrangements which, even though they are not expressly described or illustrated here, embody the principles of the disclosure and are contained in the essence and scope of protection thereof. Furthermore, all examples presented here are intended to be used, in principle, only for teaching purposes in order to assist the reader in understanding the principles of the disclosure and the concepts contributed by the inventor(s) for further development of the art, and should be interpreted as serving not to limit such specially presented examples and conditions. Furthermore, all statements herein regarding principles, aspects and examples of the disclosure as well as particular examples thereof are intended to encompass the equivalents thereof.

A block diagram may for example illustrate a conceptual view of an exemplary circuit embodied by the principles of the disclosure. In a similar manner it goes without saying that all flow charts, flow diagrams, state transition diagrams, pseudo code and the like represent various processes which are substantially represented in a computer readable medium and thus implemented by a computer or processor, irrespective of whether such a computer or processor is expressly illustrated. The methods disclosed in the description or in the claims may be carried out by means of a device comprising means for carrying out each of the respective steps of said methods.

Furthermore, it goes without saying that the disclosure of multiple actions or functions disclosed in the description or the claims should not be interpreted as being in the specific order. The disclosure of multiple actions or functions therefore does not limit them to a specific order, unless said actions or functions are not interchangeable for technical reasons. Furthermore, in some examples, a single action may include or be broken down into a plurality of sub actions. Such sub actions may be included and form part of the disclosure of said single action, provided that they are not expressly excluded.

Furthermore, the following claims are hereby incorporated in the detailed description, where each claim may represent a separate example by itself. If each claim may represent a separate example by itself, it should be noted that—even though in the claims a dependent claim may refer to a particular combination with one or more other claims—other examples may also include a combination of the dependent claim with the subject matter of any other dependent or independent claim. These combinations are proposed here, provided that there is no indication that a specific combination is not intended. Furthermore, features of a claim are also intended to be included for any other independent claim, even if said claim is not made directly dependent on the independent claim.

What is claimed is:

1. A semiconductor device, comprising:
   at least one suspension region of a membrane structure, wherein the suspension region lies laterally in a first region of a surface of a semiconductor substrate; and a membrane region of the membrane structure, wherein a cavity is arranged vertically between the membrane region and at least one part of the semiconductor substrate, wherein the first region of the surface of the semiconductor substrate is formed by and corresponds to a surface of a shielding doping region of the semiconductor substrate, wherein the shielding doping region of the semiconductor substrate adjoins an adjacent doping region, wherein the adjacent doping region forms at least one part of the surface of the semiconductor substrate in the region of the cavity, and wherein the adjacent doping region has a first conductivity type and the shielding doping region has a second conductivity type opposite the first conductivity type.

2. The semiconductor device as claimed in claim 1, wherein the suspension region of the membrane structure extends laterally from the cavity maximally as far as an edge of the first region of the surface of the semiconductor substrate.

3. The semiconductor device as claimed in claim 1, wherein the suspension region of the membrane structure is arranged laterally completely within the first region of the surface of the semiconductor substrate.

4. The semiconductor device as claimed in claim 1, wherein the adjacent doping region laterally completely surrounds the shielding doping region within the semiconductor substrate.

5. The semiconductor device as claimed in claim 1, wherein the adjacent doping region is a well doping region or a bulk doping region of the semiconductor substrate.

6. The semiconductor device as claimed in claim 1, wherein a maximum vertical distance between points at the surface of the semiconductor substrate in the region of the cavity is less than 10 nm.

7. The semiconductor device as claimed in claim 1, wherein the adjacent doping region comprises:
   a first subregion having an average dopant concentration of more than $1*10^{17}$ atoms per cm3 and less than $1*10^{21}$ atoms per cm3; and
   a second subregion having an average dopant concentration of more $1*10^{16}$ atoms per cm3 and less than $1*10^{18}$ atoms per cm3,
      wherein the first subregion has a vertical dimension of more than 50 nm, and
      wherein the second subregion has a vertical dimension of more than 100 nm,
      wherein the first subregion of the adjacent doping region is arranged vertically between the surface of the semiconductor substrate and the second subregion of the adjacent doping region, and
      wherein the subregion of the adjacent doping region the second subregion of the adjacent doping region are arranged laterally between the shielding doping region and a counterelectrode doping region.

8. The semiconductor device as claimed in claim 1, wherein a second region of the surface of the semiconductor substrate in the region of the cavity is formed by a counterelectrode doping region, and wherein the counterelectrode doping region has the second conductivity type.

9. The semiconductor device as claimed in claim 8, wherein a lateral dimension of the counterelectrode doping region is more than 30% of a lateral dimension of the cavity.

10. The semiconductor device as claimed in claim 8, wherein the shielding doping region is laterally separated from the counterelectrode doping region by the adjacent doping region.

11. The semiconductor device as claimed in claim 1, wherein a vertical distance between the membrane structure and the surface of the semiconductor substrate at a feedthrough part of an edge of the membrane structure is more than 50% of a vertical distance between the membrane region of the membrane structure and the surface of the semiconductor substrate in the region of the cavity in a non-loaded state of the membrane region of the membrane structure.

12. The semiconductor device as claimed in claim 1, furthermore comprising a contacting structure, wherein different voltages are able to be applied to the membrane structure and the shielding doping region of the semiconductor substrate via the contacting structure.

13. The semiconductor device as claimed in claim 1, further comprising a control circuit, wherein the control circuit is configured to provide a same voltage to the membrane structure and the shielding doping region of the semiconductor substrate.

14. The semiconductor device as claimed in claim 1, furthermore comprising a control circuit, wherein the control circuit is configured to provide electrical signals having a same signal waveform to the membrane structure and the shielding doping region of the semiconductor substrate.

15. The semiconductor device as claimed in claim 1, wherein the suspension region of the membrane structure at the surface of the semiconductor substrate is in contact with the shielding doping region.

16. The semiconductor device as claimed in claim 1, wherein an insulation layer is arranged vertically between the suspension region of the membrane structure and the shielding doping region.

17. The semiconductor device as claimed in claim 1, wherein in the region of the cavity an insulation layer lies at the surface of the semiconductor substrate or at a surface of the membrane region of the membrane structure.

18. A semiconductor device, comprising:
   at least one suspension region of a membrane structure, wherein the suspension region lies laterally in a first region of a surface of a semiconductor substrate, and wherein an insulation layer is arranged vertically between the suspension region of the membrane structure and the first region of the surface of the semiconductor substrate; and
   a membrane region of the membrane structure, wherein a cavity is arranged vertically between the membrane region and at least one part of the semiconductor substrate,
   wherein a maximum vertical distance between points at an edge area of the cavity that faces the semiconductor substrate is less than 10 nm.

19. A pressure sensor, a microphone or an acceleration sensor comprising a semiconductor device as claimed in claim 18.

20. A semiconductor device, comprising:
   at least one suspension region of a membrane structure, wherein the suspension region lies laterally in a first region of a surface of a semiconductor substrate;
   a membrane region of the membrane structure, wherein a cavity is arranged vertically between the membrane region and at least one part of the semiconductor substrate, wherein the suspension region laterally delimits the cavity; and
   an insulation layer arranged at a surface of the at least one part of the semiconductor substrate under the membrane structure and the cavity, wherein the insulation layer has a lateral extent limited to the cavity.

* * * * *